United States Patent [19]

Lamb, III et al.

[11] Patent Number: 5,110,697
[45] Date of Patent: May 5, 1992

[54] MULTIFUNCTIONAL PHOTOLITHOGRAPHIC COMPOSITIONS

[75] Inventors: James E. Lamb, III; Terry Brewer; J. Michael Mori, all of Rolla, Mo.

[73] Assignee: Brewer Science Inc., Rolla, Mo.

[21] Appl. No.: 626,967

[22] Filed: Dec. 13, 1990

Related U.S. Application Data

[62] Division of Ser. No. 250,375, Sep. 28, 1988.

[51] Int. Cl.$^5$ .......................... G03F 7/30; G03F 7/11
[52] U.S. Cl. ........................................ 430/14; 430/18; 430/271; 430/323; 430/313
[58] Field of Search ................. 430/18, 271, 313, 323, 430/14

[56] References Cited

U.S. PATENT DOCUMENTS

| | | | |
|---|---|---|---|
| 2,448,542 | 9/1948 | McQueen et al. | 430/317 |
| 2,760,863 | 8/1956 | Plambeck | 430/271 X |
| 4,822,718 | 4/1989 | Latham et al. | 430/522 X |

Primary Examiner—Cynthia Hamilton
Attorney, Agent, or Firm—Veo Peoples

[57] ABSTRACT

A photolithographic composition having improved processability and which eliminates the need for inter layering multiple special purpose coatings in the production of micro-electronic devices is surprisingly made possible by selective dissolution of poly(vinylpyridine) and an effective light attenuating material in critical solvents.

1 Claim, No Drawings

MULTIFUNCTIONAL PHOTOLITHOGRAPHIC COMPOSITIONS

This is a divisional of copending application(s) Ser. No. 07/250,375 filed on Sep. 28, 1988.

BACKGROUND OF THE INVENTION

This invention relates to photolithographic compositions employed in the manufacture of micro-electronic devices, their method of manufacture, and particularly to methods for applying these compositions as multi-laminated thin films onto semi-conductor substrates.

In the manufacture of micro electronic devices, photolithographic printing is employed to fabricate circuit pattern images onto semi-conductor substrates. In this process, photosensitive films called photoresist are coated onto the substrate, exposed to light, and then developed in an alkaline developer solution. Upon development, a pattern configuration forms in the photoresist corresponding to a change in solubility of those regions of the photoresist material exposed to the irradiating light. The clarity or resolution of the lines which define these patterns at microns or even sub-micron geometries to a great extent serves as a limitation to the photolithographic process. However, photolithographic technology is approaching its ultimate limit, the point beyond which resolution cannot be improved due to diffraction effects, incompatibility of materials, and complexity of processing.

For example, one of the problems which exists in processes of this type is called reflectivity. This is caused by the fact that some of the light striking a thin layer of photoresist material will usually pass through the layer and be reflected upward from the substrate during the radiation exposure. As the incident light is generally not perfectly normal to the surface of the photoresist layer, and as it may be diffracted upon passage through the photoresist, the incident light will be reflected angularly from the surface of the substrate rather than normally therefrom. Such light will impinge upon the unexposed portions of the photoresist and some may again pass through the photoresist to strike the opaque portions of for example a photo mask, and this light will be reflected back into some portions of the photoresist which are not intended to be exposed. As a result of light being reflected back and forth between the substrate and the photoresist as well as light being scattered from surface irregularities, there may be a pronounced detrimental effect upon the ultimate resolution which can be obtained upon photo development. These problems are even more pronounced by the standing wave phenomenon and/or the reflective notching phenomenon experienced when patterning or photo developing the material.

Previous attempts to correct the reflectivity problems as disclosed in for example, U.S. Pat. No. 4,102,683, call for interposing a light absorbing layer between the surface of the substrate and the photoresist material. These so-called anti-reflective layers have the property of absorbing light which passes through the photoresist and not reflecting it back upward. They may be comprised of for example a quarter-wave plate having an odd multiple thickness of one-quarter of the wavelength of light to which the photoresist layer is sensitive. This plate is comprised of silicon dioxide thermally grown or deposited in any manner such as by the decomposition of silane. Alternatively, such a light absorbing layer may be manufactured by mixing a fluorescent dye such as an organic phosphor with an organic binder such as Fluorel made by the 3-M Company or Viton made by DuPont which is a rubber. Other prior art describing similar methods for addressing this reflective phenomenon have been discussed: M. Listvan, et al., in their text "Multiple Layer Techniques in Optical Lithography: Applications to Fine Line MOS Production", published in S.P.I.E., Volume 470, 1984, p. 85, and by R. Coyne, et al., in their article "Resist Processes on Highly Reflective Surfaces Using Anti-Reflective Coatings", published in the proceedings of the Kodak Micro-Electronics Seminar, Interface 1983. Additionally, K. Polasko, et al., discusses this phenomenon in their article "Thin Silicon Films Used as Anti-Reflective Coatings for Metal Coated Substrates", published in S.P.I.E., Volume 631, 1986, p. 181. However, such prior art anti-reflective layers have exhibited a number of problems not the least of which is the fact that in general, when the surface of the substrate is irregular, there is required an additional planarization material or layer. Other disadvantages are, for example, that when prior art organic binders have been patterned by a wet etch development, such layers develop isotropically resulting in undercutting during development which results in a narrow processing latitude or even complete lift-off of sub-micron geometries. Also, certain organic binders such as PMMA and poly butene sulfone when employed as an anti-reflective sublayer have poor stability as vehicles for etching patterns onto the substrate.

As previously mentioned, when the surface topography of the substrate is irregular, a planarization layer has sometimes been employed which may or may not contain anti-reflective material. The planarization problem stems from light scattering from the interface of the photoresist layer and the irregular surface of the substrate. The light scatters into regions of the photoresist when no exposure was intended resulting on a broadening of the line width. The amount of scattering will typically vary from region to region resulting in line width non-uniformity upon photodevelopment. Materials employed as planarization agents are for example, polymethyl methacrylate (PMMA), polyimides, or phenol-formaldehyde condensation resins such as Novolak. These planarization layers, however, in turn require the use of additional layer materials such as adhesion promoters to assist in the layer adhering to the substrate, and for example, interfacial barrier layers between the planarization layer and the photoresist absent a pre-bake prior to overcoating with a photoresist. Such planarization layers have been disclosed in for example, U.S. Pat. No. 4,370,405, and U.S. Pat. No. 4,524,121.

Interfacial mixing of the photoresist layer, and prior art sublayer materials, particularly PMMA, is detrimental to the ultimate resolution desired. This stems from the fact that prior art sublayer polymers cannot withstand overcoating of the photoresist without degrading the film's integrity. Accordingly, interfacial layers have been disclosed comprised of, for example, poly vinyl alcohol polymers, and polyimide precursors. Such interfacial barrier layers have been disclosed in H. Ohtsuka, et al., in their article "PCM Resist Process With RIE Development Method Applied for the Aluminum Etching Process", S.P.I.E., Volume 631, p. 337, 1986; and disclosed in C. Ting, et al., in their article "An Improved Deep Ultra-Violet Multi-Layer Resist Process for High Resolution Lithography", S.P.I.E., Volume 469, p. 24, 1984.

Additionally, it has been suggested in the prior art to employ a lift-off or release layer which is composed of, for example, thick films in the 1 to 3 micron range made from polysulfone polymers, polyimides specially fabricated, or other extraneous photoresist materials. This layer is applied in multi-layer lithography. After pattern transfer, such release layers can be dissolved or physically expanded in its solvent to cause release of all layers coated above it.

Examples of this technology can be found in U.S. Pat. No. 4,692,205 and U.S. Pat. No. 3,873,361. These lift-off layers are also taught to require the assistance of an adhesion promoter for both the release layer and the top photoresist material, and an oxygen etch barrier layer between the photoresist and the lift-off layer. Even with the release layer such as described in U.S. Pat. No. 4,692,205, at least two hours have been required as a practical matter for the lift-off of the layers in this system.

To improve the line resolution, given this technology, there has also been proposed surface application of a contrast enhancement layer onto the photoresist. These contrast enhancement layers have been disclosed by B. Griffing, et al., "Application of Contrast-Enhanced Lithography to 1:1 Projection Printing", S.P.I.E., Volume 469, p. 94, 1984; K. Patrillo, et al., "CEL Resist Processing for Sub Micron CMO's and Bi-Polar Circuits", S.P.I.E., Volume 920, p. 82, 1988. They disclose that these enhancement layers are photobleachable dyes in an inert resin and absorb the light diffracted from the edge of openings in a photomask used to pattern the photoresist. The enhancement layer increases contrast, which in turn, increases sidewall angle and the minimum resolution capable from a particular exposure system.

The adhesion promoters previously mentioned in passing, are required to provide the best possible adhesion between the substrate, the photoresist layer, and other layers employed in this technology. When conducting photo lithography to manufacture micron and sub-micron patterns, adhesion between the photoresist layer and the substrate must be maximized. The extremely minute area between the photoresist and the substrate and the harsh processing conditions subsequent to the application of the photoresist, render adhesion a critical parameter of the process. However, adhesion promoters are usually silicon based materials applied either by spin coating or vapor application as disclosed in U.S. Pat. No. 3,549,368 and U.S. Pat. No. 3,586,554.

The prior art has taught the application of such adhesion promoting materials in a molecular mono-layer and are limited as to what substrates they will compatibly affect adhesion, varying for example, as between silicon oxide, silicon it self, or silicon nitride. Effective adhesion by an adhesion promoting layer thicker than 100 angstroms has not been possible.

Although the above-described special layers have provided multi-layer material which solves a number of problems, the industry has been dissuaded from perfecting photolithographic processes at sub-micron levels because of the limitations with regard to these materials and the difficulty in processing these multi-laminates.

For example, not only does multi-laminate application require tedious and precise control of the individual film thicknesses, but moreover, many of the layers, particularly those previously used as anti-reflective layers, planarization layers, release layers, etc., require individual baking prior to the application of other layers which is time consuming and oftentimes requires additional equipment.

Accordingly, a new and improved composition which could be applied as a single multi-functional layer providing anti-reflectivity, adhesion, releasability, contrast enhancement, and yet could inhibit interfacial degradation of the sublayer integrity without the necessity of thermally baking the composition would be a welcomed and unexpected advancement in the art.

SUMMARY OF THE INVENTION

It is a principal object of the present invention to provide a new and improved multifunctional photolithographic composition which negates the need for multiple sub-layers interposed between the photoresist layer and the substrate of micro electronic devices or components.

It is a further principal object of the present invention to provide a new and improved method for interposing an anti-reflective sub-layer between the photoresist layer and substrate of a micro-electronic device without the need for prebaking the entire anti-reflective layer.

It is a further object of the present invention to provide a new and improved anti-reflective layer without the need for planarization, effectively interposed between the photoresist layer and the substrate of a microelectronic device without the need for an interfacial barrier.

It is a still further object of the present invention to provide a new and improved anti-reflective layer interposed between the photoresist and the substrate which is intrinsically releasable without the need for applying a release or lift-off layer.

It is an additional object of the present invention to provide an anti-reflective sub-layer interposed between the photoresist and the substrate which enhances the contrast of the patterned image by diffusion of the light attenuating component of an anti-reflective layer without detrimental interfacing of its base polymer, thereby negating the need for a contrast enhancement layer on the top surface of the photoresist.

It is a final objective of the present invention to provide a new and improved photolithographic sub-layer interposed between the photoresist and the substrate which effectively promotes adhesion between the photoresist and substrate at sub-layer thicknesses above 200 angstrom without the need for baking the sub-layer.

It is another final objective of the present invention to provide a new and improved method for defining photolithographic patterns through an anti-reflective layer by dry-etching without the need for an oxygen etch barrier layer.

These objects and others, which will become more readily apparent from the following detailed description, preferred embodiments, and illustrative examples are fulfilled by a composition comprising poly(vinylpyridine) resin, a light attenuating organic dye with absorbence of from 200 to 1,000 nanometers and a solvent having a molecular weight of between about 84 and 91, particularly 1-methoxy-2-propanol and/or cyclopentanone, having a flash point of between 28° C. and 35° C., whereby the composition will spin dry and instantly allow immediate application of the photoresist layer from the same apparatus without forming an interfacial degradation of the sublayer integrity.

DETAILED DESCRIPTION AND PREFERRED EMBODIMENTS

In accordance with the present invention, poly(vinylpyridine), preferably poly-4-vinylpyridine or poly-2-vinylpyridine homopolymers, or copolymers thereof, either alone or in combination with other resinous materials, form the resinous binder for the composition of the present invention.

In the past, poly(vinylpyridine) has been disclosed in, for example, U.S. Pat. Nos. 4,581,318 and 4,677,048 as a binder for compositions of a different type, i.e., photoresist layers sensitive to electrons and deep ultraviolet radiation. Poly(vinylpyridines) when employed in that manner, like other binders for photoresist layers such as the polyimides, phenolformaldehyde compensation products, polystyrene, and PMMA, are coated onto substrates at thicknesses ranging from about 5,000 to about 50,000 angstroms. If dyes are employed at all in such photoresist (and none were used in the above mentioned patents), the dyes are required to be soluble in base developer solution. It is particularly important to note that the poly(vinylpyridine) binders of the prior art were dissolved in methanol and baked onto the substrate.

Nevertheless, we have discovered that poly(vinylpyridine), unlike other photoresist resinous binders, may be synergistically combined with non-photosensitive dyes, insoluble in basic solutions and inert to the polymer to provide the multifunctional compositions of the present invention. They may be coated at thicknesses ranging from about 2,000 to 10,000 angstroms in a layer interposed against a dissimilar photoresist polymer or for that matter, a like photoresist polymer without interfacial degradation. Moreover, we have discovered that by selective dissolution of poly(vinylpyridines) and solvents having a molecular weight ranging between 84 and about 91 and having flush point ranging from about 28° C. to about 35° C., the poly(vinylpyridine) may be used to form a multifunctional photolithographic sublayer composition which corrects many deficiencies of the prior art.

In a particularly preferred embodiment of the present invention, the resinous binder is poly-4-vinylpyridine at molecular weights of above about 50,000 preferably 200,000. Such polymers are preferred because of their stronger stability against heat and against attack from aqueous base developer employed to develop the adjacent photoresist.

The poly(vinylpyridines) may be advantageously employed in a mixture with or as copolymers of other polymers such as polystyrenes, polyamic acids, polyurethanes, methacrylates, polyvinylcarbazoles or cellulose based polymers. It is preferred that when the poly(vinylpyridines) are used in a mixture with other polymers, that the poly(vinylpyridine) comprises at least 50% of the mixture. The polymeric binder will comprise from about 10% to about 40% by weight of the overall composition, but preferably 15-25%.

The light attenuating organic materials are employed in an effective amount to absorb, dissipate or modify the wavelength of light used to irradiate or expose the photoresist layer ultimately coated over the sublayer composition. These materials are organic dyes with strong absorbence at wavelengths used in exposure systems such as 488, 436, 405, 365, 350, 310, 280 and 240 nanometers.

These light attenuating materials must have the properties of being strong absorbers at the wavelength used to expose the photoresist, insoluble in aqueous base developer, insoluble in resist spinning solvent, non-photosensitive and inertly compatible with poly(vinylpyridine). We have discovered, that when light attenuating materials are strong absorbers of the exposure wavelength, insoluble in aqueous base developer, insoluble in resist spinning solvent, non-photosensitive and inertly compatible with poly(vinylpyridine) they synergistically function with poly(vinylpyridine) to increase adhesion to the substrate and photoresist, as well as perform as an anti-reflective coating, release layer and contrast enhancement layer. To test whether a particular dye is inertly compatible with the polymer, the solution must be allowed to stand at room temperature for 6 months with a periodic check of coating properties. Properties evaluated include thickness of spun-coated film, viscosity of mixture, particulate residues in film, uniformity of film and absorbence of the film. All these properties should remain identical for the material during the periodic test as to values generated on the original sample. We have found the following dyes to meet all of the above criteria: Calcozine Yellow FW (Color Index #41001), Chrysiodine Yellow Base A (CAS#459-54-5 solvent orange 3), Savinyl Yellow 5GLS (Solvent Yellow 138), Rhodamine B (Color Index #45170), Waxoline Yellow RP FW (Color Index #11855), Ceres Yellow GRN (Color Index #21230), Bixin (Color Index #75120) Calcofluor White RWP (Color Index Fluorescent Brightener #61), Oil Yellow E-190 (Color Index #11021), 6'-Butoxy-2,6-diamino-3,3'-Axo dipyridine, Reakt Yellow 186, proprietary available from: BASF Wyandotte Corporation, Holland, MI and Hematoporphyrin IX Dimethyl Ester, proprietary available from: Porphyrin Products, Inc., Logan, Utah. By the selection of absorbing material the film can be made to absorb a narrow or broadband of wavelengths, thus allowing tuning of the composition for any absorbence needed to cover the full range of photoresist exposure wavelengths.

A particularly preferred embodiment for the light attenuating organic material comprises a mixture of from 20 to 65% Calcozine yellow FW, (color index number 41001), 5 to 30% chrysiodine yellow base A (solvent orange 3), 3 to 20% Waxoline yellow RP FW (color index number 11855), and 0.5 to 5% Rhodamine B (color index #45170) by weight of the total light attenuating organic mixture. Generally, the light attenuating material or mixture may range in amount in a weight to weight ratio of dye to polymer of from 1.3:1 to 1.0:15.

We have surprisingly found that even though the more standard solvents for poly(vinylpyridine) such as methanol, do not perform effectively in the composition of the present invention either because they do not permit a sufficiently uniform coating onto the substrate or because they form latent, residuals which contaminate the film even after spin-coating. Particular solvent and solvent mixtures having molecular weights between about 84 and about 91 and flash points of between about 28° C. and 35° C., will effectively produce the photolithographic composition without interfacial degradation of the composition. It is particularly preferred in the composition of the present invention to employ 1-methoxy-2-propanol and cyclopentanone. These solvents may be used either alone or in combination in the preferred embodiment in the present invention.

Additional components may be employed if desired, to supplement the invention without detracting from its multifunctional capability. For example, various nitrogen compounds including, for example, 4-nitrobenzaldehyde; 2,4-dinitroaniline; anisol and the like, may be employed to increase oxygen plasma etch rate. Additionally, if desired, cross-linking agents such as Cyracure UVR resins (available from Union Carbide Company) and Isocyanatoethyl Methacrylate (from Dow Chemical Company) may be employed.

In the process of the present invention, the composition may be coated onto a wide variety of micro-electronic substrates, effectively adhering thereto, while also surprisingly offering releasability or lift-off. Such substrates are, for example, silicon wafers, glass plates, gallium arsinide wafers, quartz plates, silicon oxide film, polysilicon films, aluminum films, tungsten films, chrome films, idium tin oxide films, or the like, used to make micro-electronic devices such as dram and sram memories, micro-processors, CMOS, NMOS, and a bi-polar devices, including data storage devices, such as laser discs and the like.

The compositions may be coated onto substrates by spin coating, roller coating, spray coating, offset printing, screen printing, and the like, at film thicknesses ranging from about 200 angstroms to 11 microns or higher. The films exhibit excellent adhesion. Furthermore, they instantly set onto substrates so as to permit subsequent coating of a photoresist material.

The photoresist surprisingly can be instantly and directly coated onto the compositions of the present invention in the same coating apparatus. Such photoresist may be comprised of any number of polymeric binders and their attendant solvents without incurring interfacial degradation of the polymeric binder of the composition of this invention by way of spin removal or diffused polymeric admixture. Such photoresist polymers may be any convention photoresist regardless of whether it is positive or negative working, so long as basic developer solution is employed. It is particularly preferred to spin coat the photoresist material onto the sublayer composition of the present invention in the same spin coater.

Subsequently, the photoresist layer may be cured using standard resist cure conditions recommended by the manufacturer.

Thereafter, the photoresist is exposed to irradiation directed in a particular configuration or pattern. Those areas of the photoresist which are exposed, undergo conversion of their solubility relative to aqueous base solutions. That is, they either become soluble, if initially insoluble, or the reverse. Accordingly, it is particularly desirable that the absorbence of organic dyes and the index of refraction of the polyvinylpyridine polymer, copolymer, homopolymer or mixture matches the index of the refraction of the photoresist. This, in turn, strongly influences the elimination of detrimental reflectivity problems, inhibition of standing waves, and suppression of reflective notching.

A post-exposure bake of between about 85° and 120° C. may be desirable in some applications to promote contrast enhancement. This surprisingly, serves to diffuse the light attenuating organic dyes from the composition itself into the photoresist layer even though the polymer does not interfacially diffuse into the photoresist. The extent of the contrast enhancement can be controlled by the dye to polymer ratio of the present composition and by time and temperature of the post-bake operation. For example, dye to polymer ratios from about 1.3:1 and higher provide a higher level of contrast enhancement with no post exposure bake while ratios as low as 1.0:1.0 require a post-exposure bake from 85° C. to 120° C. This effect on contrast enhancement can be enhanced or reduced by time of exposure. The diffusion of the dye material during this contrast enhancement step, although not entirely understood, is believed to render partially exposed photoresist material insoluble in the aqueous developer while only slightly affecting solubility of the more intensely exposed regions.

The photoresist is then developed in aqueous alkaline developing solution. Then the composite material is thereafter etched with oxygen reactive ion etching or other dry etch to transfer the photolithographed pattern into the sublayer composition of the present invention.

At this point, the sublayer itself, can be acted upon by ion implantation or the like to transfer the pattern image into the substrate. Unlike the prior art, there is no requirement for an oxygen etch barrier layer between the resist and the anti-reflective layer.

It is especially advantageous that the releasability of the composition of the present invention is accomplished within as little as 15 to 20 minutes as opposed to the exceedingly long (for example, 2 hours) lift-off requirements of the prior art. The release or lift-off comparison is the same whether by solvent removal or stripping.

Although it was previously reported that poly(vinylpyridines) were thermally stable, it was not known whether thin films composed of such resins when loaded with dyes would remain stable and homogenous when processed as a sublayer between a photoresist layer and a micro-electronic substrate during, for example, post-bake operations nor during the irradiation exposure step. However, we have found the present invention to achieve this measure of stability.

The following examples are intended to illustrate the invention.

EXAMPLES

Example 1

Preferred Formulation and Application Testing 2.3% Poly(4-vinylpyridine)
1.6% Calcozine Yellow FW
0.5% Chrysiodine Yellow Base A
0.5% Waxoline Yellow RP FW
0.1% Rhodamine B
57.0% 1-Methoxy-2-Propanol
38.0% Cyclopentanone
a reddish-yellow coating was prepared by stirring the mixture for several hours. The mixture was then filtered to remove undissolved material. The coating may be used to replace adhesion promoters, planarization layers, anti-reflective coatings, absorbing layers, interfacial mixing barrier, release layer, contrast enhancement layer or any combination thereof with a single material and process. This material was applied to a substrate using the following steps: disclosed material was coated on substrate spinning at 5000 RPM for 30 seconds, Microposit 1470 resists (available from Shipley, Newton, Mass.) was spin coated at 5000 RPM for 30 seconds, resist was then exposed on a Cobilt CA400 broadband contact printer with 150 millijoules/square centimeter, the exposed resist was developed with Shipley Microposit MF312 developer diluted with deionized water 1:1 for 15 seconds at 20° C., the disclosed material was etched in a parallel plate etcher. The oxygen etch was conducted at 900 watts power, 400 millitorr vacuum and oxygen flow rate of 150 ml/minute for 3 minutes. This produced resist structures of 0.5 micron that can be used to transfer patterns to aluminum, polysilicon, oxides and the like to make microelectronic devices.

A quartz slide was coated with the disclosed material as described above. Absorbance was measured from 240-500 nm wavelengths. This slide was then coated with resist as stated above and cured at 110° C. for 60 seconds on a hotplate. The slide was then blanket exposed to completely photo bleach the resist at 436 nm. Absorbance was then measured again and the difference between the absorbance before and after resist application was determined. This gave a measure of interfacial mixing. This formula gave a coating 1000 Å thick with absorbance as follows:

| Wavelength (nm) | Absorbance |
| --- | --- |
| 436 | .536 |
| 405 | .378 |
| 365 | .238 |
| 248 | .439 |

No significant change was detected in the interfacial mixing test following resist application and exposure.

Example 2

Formulation Using Different Absorbing Material 2.3% Poly(4-vinylpyridine)
1.5% Calcozine Yellow FW
0.5% Chrysiodine Yellow Base A
0.3% Reakt Yellow 186
0.3% Savinyl Yellow 5GLS
0.1% Rhodamine B
57.0% 1-Methoxy-2-Propanol
38.0% Cyclopentanone
a reddish-yellow solution was prepared and patterned, as described for Example 1 except that glass slides were used in the absorbance measurement for wavelengths from 360 to 500 nm. The film coated to 1200 Å thick with the following absorbances. No interfacial mixing detected.

| Wavelength (nm) | Absorbance |
| --- | --- |
| 436 | .593 |
| 405 | .341 |
| 365 | .237 |

Example 3

Formulation Using Different Absorbing Material 2.3% Poly(4-vinylpyridine)
1.5% Calcozine Yellow FW
0.5% 6'-Butoxy-2,6-Diamino-3,3-Azodipyridene
0.3% Reakt Yellow 186
0.3% Savinyl Yellow 5GLS
0.1% Rhodamine B
57.0% 1-Methoxy-2-Propanol
38.0% Cyclopentanone
a reddish-yellow solution was prepared and patterned, as described for Example 2. The coating resulted in film thickness of 1100 Å with no interfacial mixing and the following absorbance properties:

| Wavelength (nm) | Absorbance |
| --- | --- |
| 436 | .619 |
| 405 | .416 |
| 365 | .261 |

Example 4

Formulation Using Different Absorbing Material and Solvent System 5.25% Poly(4-vinylpyridine)
2.63% Calcozine Yellow FW
2.63% Chrysiodine Yellow Base A
89.49% 1-Methoxy-2-Propanol
a reddish-yellow solution was prepared and patterned, as described for Example 2. The coating resulted in a film thickness of 3000 Å with no interfacial mixing and the following absorbance properties:

| Wavelength (nm) | Absorbance |
| --- | --- |
| 436 | 1.579 |
| 405 | 1.172 |
| 365 | 1.035 |

Example 5

Formulation Using Mixed Polymer System 2.3% Poly(1-butene-co-sulfurdioxide) (PBS)
2.3% Poly(4-vinylpyridine)
2.3% Flexo Yellow 105 LD
2.3% Chrysiodine Yellow Base A
42.8% Cyclohexanone
48.0% 1-Methoxy-2-Propanol
a yellow solution was prepared by stirring the mixture for several hours. The mixture was then filtered to remove any undissolved material. PBS was used to increase the rate of etch in plasma etching. Other properties are discussed in Example 2. Etch rates ratios were determined by etching the film in the oxygen plasma etcher as described in Example 1 except that the etch interval was done in 3 steps with thickness remaining after etching determined for each step. A plot of the amount of material etched versus time provided the etch rate which was then divided by the resist etch rate to give the etch rate ratio. This formulation achieved an etch rate ratio of 1.3 versus the material in Example 4 which had a etch rate ratio of approximately 1.0. This film gave a 3300 Å coating thickness which demonstrate interfacial mixing problems with resist and had absorbance properties as follows:

| Wavelength (nm) | Absorbance |
| --- | --- |
| 436 | 1.724 |
| 405 | 1.368 |
| 365 | 1.180 |

Example 6

Formulation Using Additive to Increase Oxygen Plasma Etch Rate 4.5% Poly(4-vinylpyridine)
2.7% Flexo Yellow 105 LD 1.8% Iosol Yellow
0.7% 2,4-Dinitroaniline
90.3% 1-Methoxy-2-Propanol
a yellow solution was prepared by stirring the mixture for several hours. The mixture was then filtered to remove any undissolved material. 2,4-Dinitroaniline was used to increase the rate of etch in plasma etching. Etch rate ratios were determined as in Example 6. Results indicate that etch rate ratio of disclosed layer to resist was 1.2. This film gave a 3000 Å coating thickness which demonstrated no interfacial mixing problems with resist and had absorbance properties as follows:

| Wavelength (nm) | Absorbance |
|---|---|
| 436 | 1.352 |
| 405 | 0.804 |
| 365 | 0.987 |

Example 7

Formulation Using Additive to Decrease Resist Intermixing and Aqueous Base Developer Solubility 1.8% Poly(4-vinylpyridine)
varied Cyracure UVR6100 levels
0.2% Chrysiodine Yellow Base A
2.1% Calcozine Yellow FW
95.4% 1-Methoxy-2-Propanol
a yellow solution of each level of Cyracure UVR6100 was prepared by stirring the mixture for several hours. The mixtures was then filtered to remove any undissolved material. Cyracure UVR6100 was used to increase the coating resistance to aqueous base developers and to decrease interfacial mixing of the coating with photoresist. Levels of Cyracure UVR6100 were 0%, 10%, and 15% of polymer solids. The amount of development was 190 Å, 100 Å and 50 Å respectively, while no interfacial mixing was detected for any of the samples. Process was performed on silicon wafers as in Example 1 through the development step.

Example 8

Manufacture of Polysilicon Structures

Using the material from Example 4, the material was spin coated at 5000 RPM for 30 seconds on 5 inch substrates with polysilicon steps, Shipley 1400-27 resist was spin coated at 5000 RPM for 25 seconds, resist cured at 110° C. for 55 seconds. Wafers were then exposed for 800 milliseconds on a Cannon G-line stepper, the resist was spray developed with Shipley 320 developer for 45 seconds at 22° C., the disclosed material was then reactive ion etched in oxygen/argon plasma for 10 seconds, then the polysilicon reactive ion etch was conducted to transfer the pattern to polysilicon and the remaining resist and disclosed material were remove by oxygen plasma etching. The final results showed good linewidth control over stepped topography for 0.8 micron polysilicon structures.

Example 9

Contrast Enhancement Effects of Disclosed Material

Using the material from Example 4, and processed as discussed in Example 8 except that 4 inch aluminum substrates were used and the exposure dose was increased to 1000 milliseconds. The process was run also for Brewer Science's commercially available organic anti-reflective coating with the exposure dose optimized for each process. The anti-reflective coating process required an exposure dose of 300 milliseconds. Following development, submicron structures were inspected for both systems. The particular structures of interest were a group of square posts of varying sizes with equally sized spaces from 1.2 microns to 0.4 microns. These structures were intact to 0.4 microns but showed resist scumming between the structures at 0.45 microns for the disclosed material. The remarkable observation about these structures was that they remained square with vertical sidewall angles down to 0.45 microns, well below the minimum resolution capabilities of the exposure equipment used. Though the wet developable anti-reflective coating showed these structures intact to 0.7 microns the structures were rounded due to the resolution capabilities of the exposure system. Line space pairs were intact down to 0.55 microns though the square posts were totally missing at that point for wet developable absorbing coatings. Both coatings below the resist stopped reflective problems. However, only the disclosed material had a significant impact on the resist contrast, extending the resolution below that which the tool was designed for.

Example 10

Comparative Example of the Adhesion Functionality

The material of Example 4 was applied to 3 inch aluminum, silicon nitride, silicon and silicon oxide as described in Example 1. Samples of each substrate were also prepared with HMDS adhesion promoter. The adhesion promoter received a 130° C., 30 second hotplate bake. Resist was coated on all substrates and exposed as described in Experiment 1. The patterned films were then developed in 1:1 MF312 developer diluted with deionized water. The development was conducted at 21° C. for 20, 40, 80 and 160 second develop time. Standard develop times for this system are 15 to 20 seconds. The over development was used to stress the adhesion of the geometries patterned onto the substrate. There are three structures evaluated and given a ranking to determine adhesion. These structures are daggers (D) a series of decreasing sizes of posts (P) and a series of decreasing sizes of isolated lines called a comb (C) structure. To normalize the data the following equation is used.

$$SCORE = P + 3C - 4D$$

each structure is evaluated for the smallest structures remaining intact after exposure to the developer. The higher score represents better adhesion. The results are as follows:

| SYSTEM | SUBSTRATE | SECONDS OF DEVELOPMENT | | | |
|---|---|---|---|---|---|
| | | 20 | 40 | 80 | 160 |
| | | SCORE | | | |
| HMDS | ALUMINUM | 31 | 31 | 30 | 21 |
| | NITRIDE | 36 | 36 | 34 | 34 |
| | SILICON | 37 | 36 | 38 | 37 |
| | OXIDE | 31 | 29 | 26 | 27 |
| DISCLOSED MATERIAL | ALUMINUM | 47 | 47 | 47 | 47 |
| | NITRIDE | 47 | 47 | 47 | 47 |
| | SILICON | 47 | 47 | 47 | 47 |
| | OXIDE | 47 | 46 | 46 | 47 |

Example 11

Comparative Evaluation of Other Polymer Systems

Many polymer systems were evaluated including those mentioned in the prior art by Brewer Science Patent application Ser. No. 431,798 such as PMMA and PBS. In this test polymers and dye systems were prepared where the dyes consisted of those found in the material of Experiment 4. Where possible the solvents used in Experiment 4 were used as well. All the materials were evaluated for coat quality after a 5000 RPM spin for 30 seconds without a bake process. The films that had good coats were further evaluated to determine if they had interfacial mixing with the resist. This test was conducted as specified in Example 2.

| POLYMER | COAT QUALITY | INTERFACIAL MIXING |
|---|---|---|
| ETHYL CELLULOSE | GOOD COAT | COMPLETE DISOLUTION |
| PMMA | GOOD COAT | 80% STRIPPING |
| POLYSTYRENESULFONE | GOOD COAT | 85% STRIPPING |
| POLY-2-VINYL PYRIDINE | GOOD COAT | 13% STRIPPING |
| POLY-4-VINYL PYRIDINE | GOOD COAT | <5% STRIPPING |
| POLYCARBONATE | GOOD COAT | 81% STRIPPING |
| PBS | GOOD COAT | 85% STRIPPING |

The polyvinylpyridines are the only candidates that show significant resistance to photoresist solvent attack even though most of the systems tested are reported to be insoluble in photoresist solvents such a cellosolve acetate.

Example 12

Comparative Evaluation of Release Properties

To test the functionality of the disclosed material as a release layer to those given by prior art such as polyimides and positive two component photoresist such as Shipley Microposit 1470 resist as indicated in U.S. Pat. Nos. 4,692,205 and 3,873,361. In this test for resist and polyimide sublayers the 3 inch silicon substrates were first coated with an adhesion promoter and baked at 110° C. for 30 seconds on a hotplate. Two substrates were then coated with polyimide by spinning at 5000 RPM for 60 second followed by a beta stage bake of 135° C. in a convection oven for 30 minutes. Two substrates not coated with adhesion promoter were coated with the disclosed material as described in Experiment 1. Both the wafers coated with polyimide and those coated with the disclosed material were coated with resist as described in Experiment 1. Two silicon substrates with adhesion promoter were also coated with resist. The resist and the resist polyimide substrates were patterned with aqueous based developer. The substrates with the disclosed material was patterned by oxygen plasma etching. One of each type of film processed was exposed to 200° C. for 30 minutes while the remaining substrate from each set were exposed to 250° C. temperature for 30 minutes. All the substrates were then allowed to soak in 99-AL photoresist stripper at 60° C. The stripper is available from Mallinckrodt (St. Louis, Mo.). After 17 minutes both wafers with the disclosed material as a base layer were completely clean. Both other substrate types showed no evidence of resist removal at up to 1 hour, at that point the test was discontinued.

It will be appreciated by those skilled in the art that variations in the invention disclosed herein may be made without departing from the spirit of the invention. The invention is not to be limited by the specific embodiments disclosed herein, but only by the scope of the claims appended hereto.

What is claimed is:

1. An imaged article of manufacture compromising:
   a) A top layer of photoresist material,
   b) A multifunctional sublayer consisting essentially of poly(vinylpyridine), a base-insoluble, non-photosensitive light attenuating material, inertly compatible to poly(vinylpyridine), and
   c) A micro-electronic substrate, and
   d) made by
      i. selective dissolution of the poly(vinylpyridine) and an effective amount of the inertly compatible, base-insoluble, non-photosensitive light attenuating material, said selective dissolution being in a polar organic solvent having a molecular weight from about 84 to about 91, and having a flash point of from 28° C. to about 35° C.;
      ii. Spin-coating the composition of step i onto the micro-electronic substrate;
      iii. Immediately subsequent thereto spin-coating the photoresist onto the composition of step i;
      iv. Exposing the photoresist to light and developing an image in the photoresist by using a basic developer solution; and
      v. Dry-etching the image through the composition of step i and onto the micro-electronic substrate.

* * * * *